United States Patent [19]
Milligan

[11] 3,932,812
[45] Jan. 13, 1976

[54] MOTOR SPEED INDICATOR

[75] Inventor: Lee J. Milligan, Fairfield, N.J.

[73] Assignee: Peripheral Equipment Corporation, Fairfield, N.J.

[22] Filed: Mar. 20, 1974

[21] Appl. No.: 452,754

[52] U.S. Cl. .............................. 324/161; 324/78 Q
[51] Int. Cl.² .......................................... G01P 3/56
[58] Field of Search ........... 324/161, 78 Q; 340/263

[56] References Cited
UNITED STATES PATENTS

| 3,146,432 | 8/1964 | Johnson | 324/161 |
|---|---|---|---|
| 3,585,400 | 6/1971 | Brayton | 324/161 |
| 3,719,888 | 3/1973 | Sampey | 324/161 |
| 3,739,367 | 6/1973 | Fathauer | 324/161 |

OTHER PUBLICATIONS

E. M. Dumstorff et al, Digital Speed Checking Circuit, IBM Tech. Discl. Bull., 15(12), May, 1973, pp. 1223.

Primary Examiner—Alfred E. Smith
Assistant Examiner—Rolf Hille
Attorney, Agent, or Firm—George E. Kersey

[57] ABSTRACT

Apparatus for indicating when a change has taken place in a desired operating condition of a device using retriggerable multivibrators which are adjusted to represent particular periods with respect to the desired operating rate of the device. In the case of a motor, the multivibrators indicate when the motor is operating at, below or above a desired operating speed.

8 Claims, 3 Drawing Figures

MOTOR SPEED INDICATOR

BACKGROUND OF THE INVENTION

This invention relates to the indication of changes in a desired operating condition and, more particularly, to the indication of when a motor is operating at, above or below a desired speed.

The operating condition of a device is frequently represented by a signal which is compared with a reference to provide a measure of the departure of the signal from a desired condition.

Such an arrangement has the disadvantages of requiring a precision reference source. It also requires a precision, high gain comparitor that typically acts either on frequency or amplitude levels.

Accordingly it is an object of the invention to provide a suitable indicator for changes in a specified operating condition.

Another object is to provide a suitable indicator for departures from a desired motor speed condition.

A further object is to provide an indicator which does not require a precision reference source, or a precision comparitor for frequency or amplitude level.

SUMMARY OF THE INVENTION

The invention provides an indication of departures from a desired operating condition. A signal is generated in accordance with the actual operation of a device and used to activate respective units which give a measure of two different departures from the desired condition, for example, slow and fast operation.

Each unit, when activated, has its own independent period of operation. The periods of the units are respectively greater and less than the desired period. If the period of actual operation falls below the period of the first unit, a "slow" condition is indicated. Conversely if the period of actual operation is is above the period of the second unit, a "fast" condition is indicated.

BRIEF DESCRIPTION OF THE DRAWINGS

Other aspects of the invention will become apparent after considering an illustrative embodiment, taken in conjunction with the drawings which.

DETAILED DESCRIPTION

Figure 1:
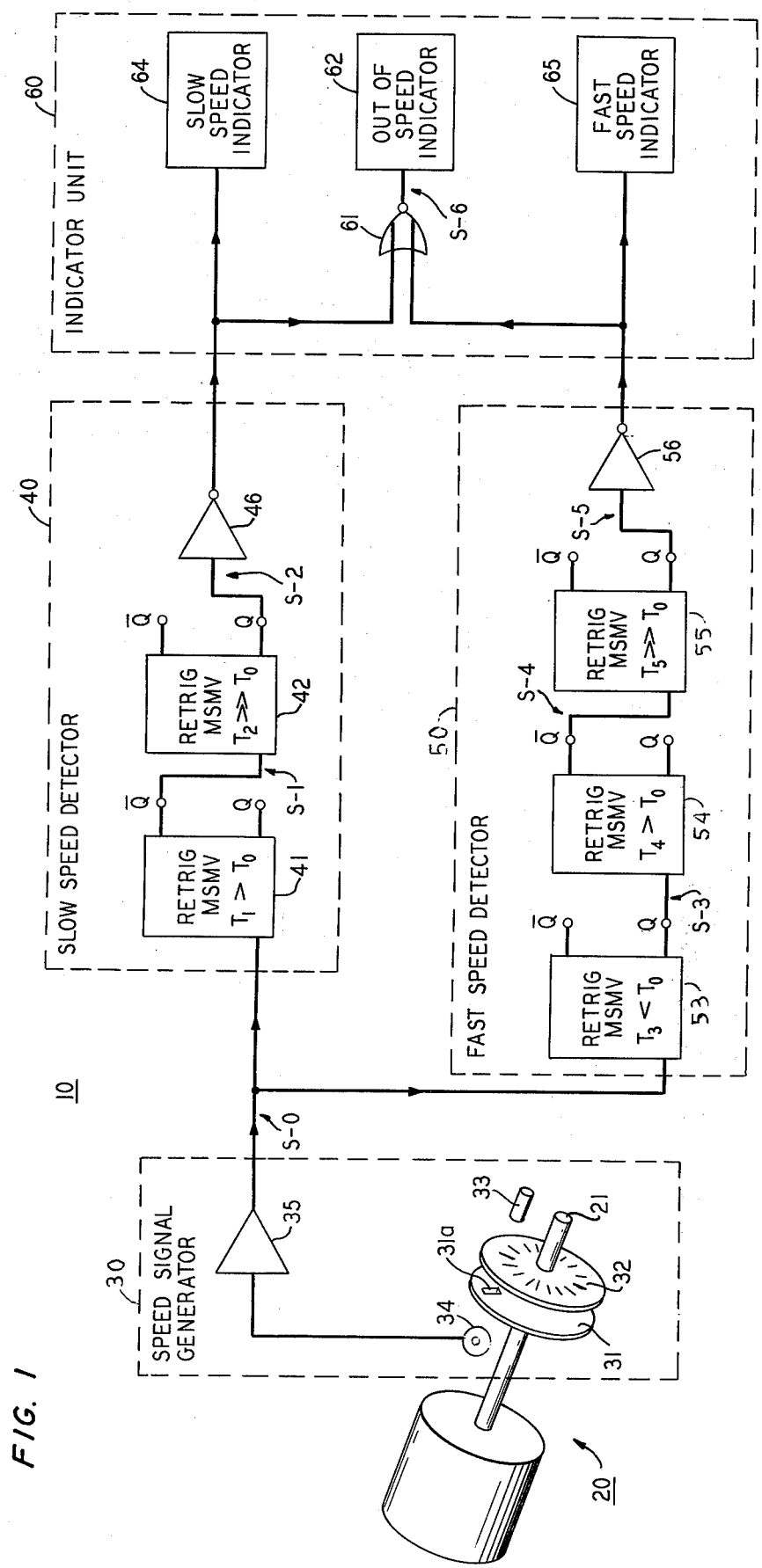
FIG. 1 is a schematic and block diagram of a motor speed indicator system in accordance with the invention.

Turning to the drawings, an indicator system 10 according to the invention is shown in FIG. 1. Signals that represent the speed of a source unit 20 are produced by a speed signal generator 30 and applied to both a slow speed detector 40 and a fast speed detector 50. Outputs from the detectors 40 and 50 are then applied to a unit 60 which provides an indication of whether the unit 20 is "out of speed", i.e., operating either at too slow a speed or too fast a speed.

The unit can be any device that rotational or linear motion. Illustrative devices are A.C. and D.C. electric motors, reciprocating engines, turbine engines, solenoids, diaphragms, and air-actuated pistons.

Figure 2:
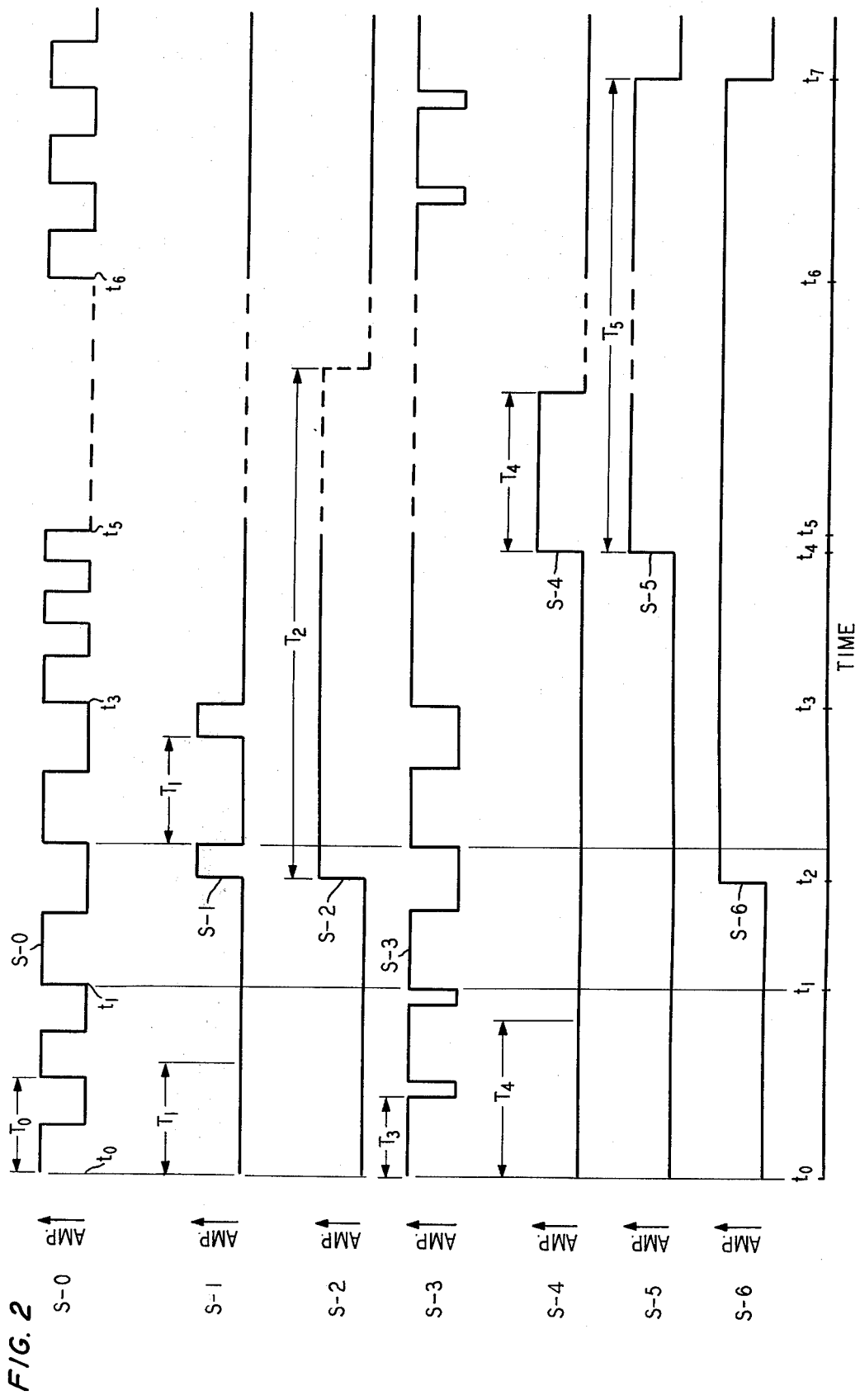
FIG. 2 is a set of waveforms illustrating the operation of the motor speed indicator system of FIG. 1.

The particular unit 20 of FIG. 2 is an electric motor for which the speed signal generator 30 is a tachometer that produces pulses representing the motion of the motor 20. The particular tachometer of FIG. 1 is formed by an apertured disc 31 and a lined disc 32 on a motor shaft 21. The lines on the disc 32 serve to make and break a light beam from a light source 33, through an aperture 31a to a photo sensitive device 34, such as a photo conductor, photo diode, or photo transistor. The output of the device 34 is a series of pulses representative of its motion. Other tachometers, such as switch tachometers (not shown) may be employed as well, consisting of a wheel, tape or bar with conductors evenly spaced. The conductors serve as contacts for a pickup arm and provide an electrical path each time the arm passes over one of the conductors.

Magnetic pickup tachometers may also be employed in which pulses are provided by sensing a series of magnets attached to either a rotating or linear device. The pickup can be of the type which senses a change in flux or of the type which senses the presence of an electromagnetic field, e.g. Hall generator, magnetic diode, or other magnetic or magneto-striction device.

After being amplified (by amplifier 35) the tachometer pulses S - O, with an illustrative waveform shown in FIG. 2, are applied jointly to the detectors 30 and 40.

The detectors 30 and 40 include retriggerable monostable (one-shot) multivibrators, the outputs of which are adjusted to represent particular periods with respect to the desired motor speed. To sense that the motor is running slower than a desired speed, a first one-shot multivibrator 41 of the slow speed detector 40 is set so that its time-out period $T_1$ is just longer than the period $T_o$ of regular speed pulses from the tachometer 30, thus maintaining the Q output of the first one-shot multivibrator in a steady or "high" state and maintaining the $\overline{Q}$ output in a "low" state as indicated by waveform S-1 over the interval from $t_o$ to $t_1$ in FIG. 2.

Should the motor speed decrease, e.g., as shown at time t in FIG. 2, the period between tachometer pulses increases and exceeds the time period $T_1$ of the first one-shot multivibrator 41. The output of the first multivibrator thereafter changes state and excites a second one-shot multivibrator 42. The second multivibrator has a time period $T_2$ which is much greater than the time period $T_1$ of the first multivibrator and is used to extend the detected below speed or "out-of-sync" condition so that it will be observable by a human operator. The applicable waveform is S-2 shown in FIG. 2. This output is applied to a slow speed indicator 64 of the indicator unit 60 through an amplifier 46. It is also applied through an OR gate 61 to an out of speed indicator 62. The indicators 64 and 62 are of conventional construction.

To sense whether and when the speed of the motor has exceeded a specified, syncronous speed, the pulses from the tachometer 30 are applied, in the fast speed detector 50, to a third retriggerable one-shot multivibrator 53 with a period $T_3$ shorter than the period $T_o$ of regular tachometer pulses. When the motor runs fast, e.g. during the interval from $t_3$ to $t_5$ in FIG. 2, the third multivibrator switches and remains at its high state on its direct output Q as shown by the waveform S-3 in FIG. 2.

To eliminate any indication from the third multivibrator when the motor 20 is operating at or below speed, a fourth multivibrator 54 is employed in the fast speed detector 50, having a period T-4 which is sufficiently greater than the regular period $T_o$ so that there is no inadvertent indication by the fast speed detector 50 when the motor 20 falls below speed; as shown by the waveform S-4. A fifth multivibrator 55, corresponding to the second multivibrator 42 in the slow speed detector 40 is used to extend the fast speed indicator interval as shown by the waveform S-5. The output from the fifth multivibrator is applied through an amplifier 56 to a fast speed indicator 65 and an out-of-speed indicator unit 60. Because of the OR gate 61, the out of speed indicator 63 responds to either out of speed condition, as shown by the waveform S-6 of FIG. 2.

Figure 3:
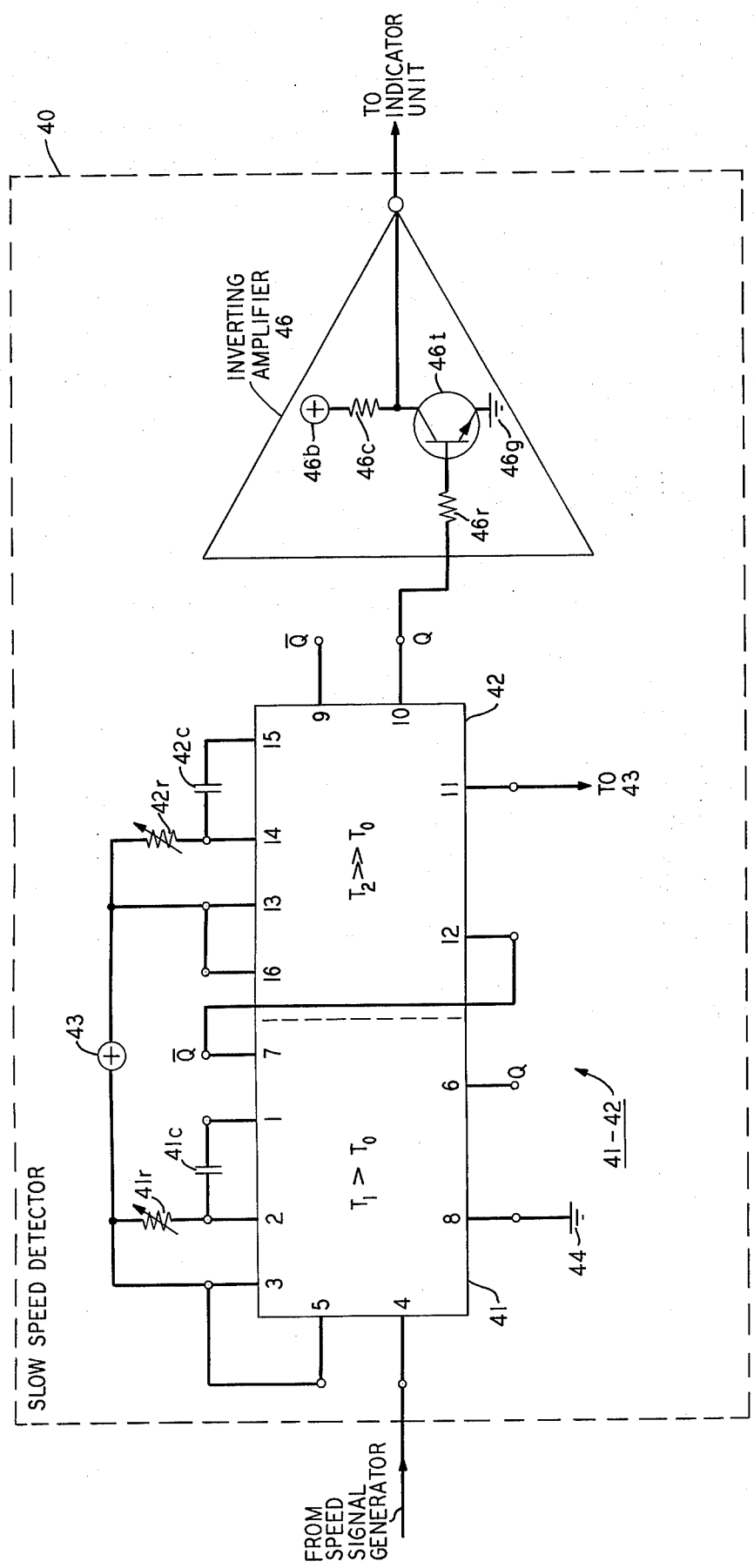
FIG. 3 is a schematic diagram of the slow speed detector portion of the indicator system of FIG. 1.

Illustrative details for the slow speed detector 40 are shown in FIG. 3. The first and second retriggerable multivibrators 41 and 42 are formed by a single integrated circuit chip. Such a chip may be the TTL 9602 "Dual Retriggerable Resettable Monostable Multivibrator" which is available from Stewart-Warner Microcircuits of Sunnyvale, California.

The dual chip 41-42 has numbered pin connectors as set forth in FIG. 3, with the input from the speed signal generator 30 applied to pin 4 and the Q output to the amplifier 46 applied from pin 10. The dual chip 41-42 is energized by a bias source 43. The time contact of the first multivibrator 41 is controlled by an adjustable resistor 41r and a capacitor 41c; while the time constant of the second multivibrator is controlled by an adjustable resistor 42r and a capacitor 42c.

The amplifier 46 is formed by a transistor $46_t$ with its emitter at ground 46g and bias from a source 46b through a resistor 46c. The input to the transistor 46 is by way of a resistor 46r.

While various aspects of the invention have been set forth by the drawings and the specification, it is to be understood that the foregoing detailed description is for illustration only and that various changes in parts and circuitry, as well as the substitution of equivalent constituents for those shown and described, may be made without departing from the spirit and scope of the invention as set forth in the appended claims.

What is claimed is:

1. Apparatus for indicating whether a motor is operating out of speed, comprising:
   a slow speed detector;
   a high speed detector; and
   an indicator unit;
   said slow speed detector including a first retriggerable multivibrator having a time period greater than the desired operating speed, and a second retriggerable multivibrator having a time period greater than that of said first multivibrator to provide a slow speed indicator signal for said indicator unit; and said high speed detector including a third retriggerable multivibrator having a time period less than said desired operating speed, a fourth retriggerable multivibrator coupled to said third multivibrator and having a time period greater than said desired operating speed, and a fifth multivibrator coupled to said fourth multivibrator and having a time period greater than that of said fourth multivibrator to provide a high speed indicator signal for said indicator unit.

2. Apparatus as defined in claim 1 wherein the retriggerable multivibrators are formed by integrated circuits.

3. Apparatus as defined in claim 2 wherein the first and second multivibrators are formed on a single integrated circuit.

4. Apparatus as defined in claim 3 wherein the second multivibrator is connected to said indicator unit by an inverting amplifier.

5. Apparatus as defined in claim 1 wherein the time constants of the multivibrators are adjustable.

6. Apparatus as defined in claim 5 wherein the time constants of the first and second multivibrators are controlled by adjustable resistors.

7. Apparatus as defined in claim 1 wherein said indicator unit includes separate slow speed and high speed indicators.

8. Apparatus as defined in claim 1 wherein said slow speed detector and said high speed detector are jointly connected to an out of speed indicator through an OR gate.

* * * * *